United States Patent
Gardner

(10) Patent No.: US 9,451,730 B2
(45) Date of Patent: Sep. 20, 2016

(54) MANAGING AIRFLOW SUPPLIED THROUGH SOFT DUCTS

(71) Applicant: Amazon Technologies, Inc., Reno, NV (US)

(72) Inventor: Brock Robert Gardner, Seattle, WA (US)

(73) Assignee: Amazon Technologies, Inc., Reno, NV (US)

( * ) Notice: Subject to any disclaimer, the term of this patent is extended or adjusted under 35 U.S.C. 154(b) by 676 days.

(21) Appl. No.: 13/787,310

(22) Filed: Mar. 6, 2013

(65) Prior Publication Data

US 2014/0254090 A1    Sep. 11, 2014

(51) Int. Cl.
*H05K 7/20*    (2006.01)

(52) U.S. Cl.
CPC ................. *H05K 7/20745* (2013.01)

(58) Field of Classification Search
CPC ........... H05K 7/20; H05K 7/20745; H05K 7/20145; H05K 7/20718; H05K 7/20709; G06F 1/206; F24D 15/00; F24F 7/00; F24F 13/02
USPC ........... 361/679.46, 679.48, 679.49, 679.51, 361/690, 691, 692, 694; 454/156, 184, 297, 454/306; 165/96, 100, 121–126
See application file for complete search history.

(56) References Cited

U.S. PATENT DOCUMENTS

| | | |
|---|---|---|
| 2,842,331 A | 7/1958 | Anderson |
| 3,834,423 A | 9/1974 | Elson |
| 3,915,477 A | 10/1975 | Timmons |
| 4,082,092 A | 4/1978 | Foster |
| 4,448,111 A | 5/1984 | Doherty |
| 5,294,049 A | 3/1994 | Trunkle et al. |
| 5,518,277 A | 5/1996 | Sanders |
| 5,655,963 A * | 8/1997 | Paschke ............... F24F 13/068 454/297 |
| 6,141,986 A | 11/2000 | Koplin |
| 6,364,009 B1 | 4/2002 | Macmanus et al. |
| 6,425,417 B1 | 7/2002 | Paschke |
| 6,459,579 B1 | 10/2002 | Farmer et al. |
| 6,558,250 B1 * | 5/2003 | Paschke ........... F16L 55/02718 454/306 |
| 6,563,704 B2 | 5/2003 | Grouell et al. |
| 6,616,524 B2 * | 9/2003 | Storck, Jr. ................ F24F 7/06 361/678 |
| 6,767,280 B1 | 7/2004 | Berger |
| 6,859,366 B2 | 2/2005 | Fink |

(Continued)

FOREIGN PATENT DOCUMENTS

| | | |
|---|---|---|
| EP | 0741269 | 11/1996 |
| EP | 2053911 | 4/2009 |

(Continued)

OTHER PUBLICATIONS

International Search Report and Written Opinion from PCT/US14/21328, mailed Jul. 8, 2014, Amazon Technologies, Inc., pp. 1-15.

(Continued)

*Primary Examiner* — Michail V Datskovskiy
(74) *Attorney, Agent, or Firm* — Robert C. Kowert; Meyertons, Hood, Kivlin, Kowert & Goetzel, P.C.

(57) ABSTRACT

A system for conveying air from one location to another includes a soft duct having a passage and an air flow control device. The air flow control device can be operated to vary a cross sectional area of a portion of the passage of the soft duct.

27 Claims, 7 Drawing Sheets

(56) References Cited

U.S. PATENT DOCUMENTS

| | | |
|---|---|---|
| 6,960,130 B2 | 11/2005 | Gebke et al. |
| 7,003,966 B2 | 2/2006 | Sharma et al. |
| 7,010,392 B2 | 3/2006 | Bash et al. |
| 7,031,154 B2 | 4/2006 | Bash et al. |
| 7,112,131 B2 | 9/2006 | Rasmussen et al. |
| 7,197,433 B2 | 3/2007 | Patel et al. |
| 7,255,322 B1 | 8/2007 | Tiwet et al. |
| 7,257,956 B2 | 8/2007 | Shimada et al. |
| 7,278,273 B1 | 10/2007 | Whitted et al. |
| 7,283,358 B2 | 10/2007 | Campbell et al. |
| 7,434,413 B2 | 10/2008 | Wruck |
| 7,500,911 B2 | 3/2009 | Johnson et al. |
| 7,716,939 B1 | 5/2010 | Morales |
| 7,804,685 B2 | 9/2010 | Krietzman |
| 7,869,210 B2 | 1/2011 | Moss |
| 8,141,374 B2 | 3/2012 | Hay |
| 8,154,870 B1 | 4/2012 | Czamara et al. |
| 8,434,526 B1 * | 5/2013 | Pinkalla .................. F24F 13/02 138/106 |
| 8,808,075 B2 * | 8/2014 | Gebke ..................... F16L 11/02 138/118 |
| 2001/0029163 A1 | 10/2001 | Spinazzola et al. |
| 2002/0021557 A1 | 2/2002 | Ishimine et al. |
| 2004/0020224 A1 | 2/2004 | Bash et al. |
| 2004/0033108 A1 | 2/2004 | Raftis et al. |
| 2004/0165349 A1 | 8/2004 | Arbogast et al. |
| 2004/0218355 A1 | 11/2004 | Bash et al. |
| 2005/0188689 A1 | 9/2005 | Juby et al. |
| 2005/0228618 A1 | 10/2005 | Patel et al. |
| 2005/0237716 A1 | 10/2005 | Chu et al. |
| 2006/0059937 A1 | 3/2006 | Perkins et al. |
| 2007/0074525 A1 | 4/2007 | Vinson et al. |
| 2007/0101746 A1 | 5/2007 | Schlom et al. |
| 2007/0213000 A1 | 9/2007 | Day |
| 2007/0240433 A1 | 10/2007 | Manole |
| 2008/0029250 A1 | 2/2008 | Carlson et al. |
| 2008/0055846 A1 | 3/2008 | Clidaras et al. |
| 2008/0094797 A1 | 4/2008 | Coglitore et al. |
| 2008/0232064 A1 | 9/2008 | Sato et al. |
| 2008/0259566 A1 | 10/2008 | Fried |
| 2008/0285232 A1 | 11/2008 | Claassen et al. |
| 2008/0305733 A1 | 12/2008 | Noteboom et al. |
| 2009/0061755 A1 | 3/2009 | Calder et al. |
| 2009/0321105 A1 | 12/2009 | Sawyer |
| 2010/0022177 A1 * | 1/2010 | Hidaka .............. B60H 1/00478 454/156 |
| 2010/0024445 A1 | 2/2010 | Cichanowicz |
| 2010/0149754 A1 | 6/2010 | Chapel et al. |
| 2010/0190430 A1 | 7/2010 | Rodriguez et al. |
| 2011/0082592 A1 | 4/2011 | Saito et al. |
| 2011/0239683 A1 | 10/2011 | Czamara et al. |

FOREIGN PATENT DOCUMENTS

| | | |
|---|---|---|
| WO | 98/34450 | 8/1998 |
| WO | 2008/143503 | 11/2008 |

OTHER PUBLICATIONS

U.S. Appl. No. 11/956,849, filed Dec. 14, 2007, Osvaldo P. Morales.

U.S. Appl. No. 12/163,146, filed Jun. 27, 2008, Osvaldo P. Morales.

\* cited by examiner

MANAGING AIRFLOW SUPPLIED THROUGH SOFT DUCTS

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carried out an organization's operations. Typically, a computer room of a computing facility includes many server racks. Each server rack, in turn, includes many servers and associated computer equipment.

Computer systems typically include a number of components that generate waste heat. Such components include printed circuit boards, mass storage devices, power supplies, and processors. For example, some computers with multiple processors may generate 250 watts of waste heat. Some known computer systems include a plurality of such larger, multiple-processor computers that are configured into rack-mounted components, and then are subsequently positioned within a rack system. Some known rack systems include 40 such rack-mounted components and such rack systems will therefore generate as much as 10 kilowatts of waste heat. Moreover, some known data centers include a plurality of such rack systems.

Many data centers rely on forced air systems and air conditioning to maintain the temperatures and other environmental conditions in the data center within acceptable limits. The initial and ongoing costs of installing and operating these systems may add substantial cost and complexity to data center operations. Many existing methods and apparatus may not, moreover, provide air for cooling in an effective manner to where it is most needed. Moreover, some known data centers include multiple rack systems having configurations that are non-uniform with respect to component density and usage, such that each rack system generates waste heat at a non-uniform rate as compared to other rack systems. In such data centers, application of uniform heat removal methods and apparatus to such non-uniform waste heat generation sources may not be fully efficient and effective in waste heat removal.

The amount of computing capacity needed for any given data center may change rapidly as business needs dictate. Most often, there is a need for increased computing capacity at a location. Initially providing computing capacity in a data center, or expanding the existing capacity of a data center (in the form of additional servers, for example), as well as cooling air for such additional capacity, is resource-intensive and may take many months to effect.

BRIEF DESCRIPTION OF THE DRAWINGS

FIG. 1A illustrates one embodiment of a soft duct that has been constricted using an air flow control device.

Figure 1:
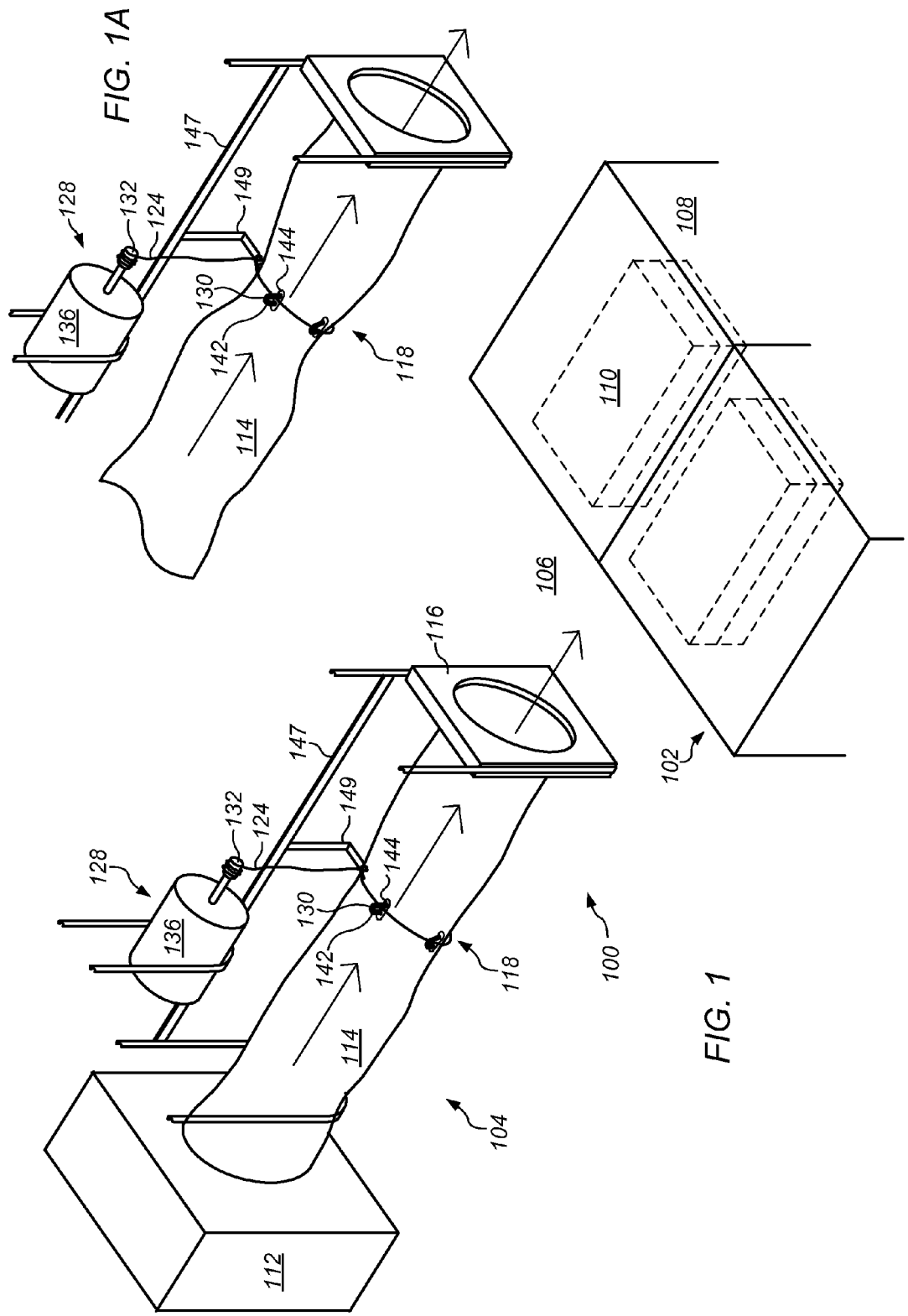
FIG. 1 illustrates one embodiment of a data center with a system for conveying air that includes a soft duct with a variable cross section control device.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of cooling systems, and systems and methods of managing flow of air to electrical systems are disclosed. According to one embodiment, a system for conveying air from one location to another includes a soft duct having a passage and an air flow control device. The air flow control device includes a motor and constricting member coupled to the motor. The motor can be operated to move the constricting member to reduce a cross sectional area of a portion of the passage of the soft duct.

According to one embodiment, a system for conveying air from one location to another includes a soft duct and an air flow control device. The soft duct has a tube and one or more passages. The air flow control device has a motor and a tube-adjusting device coupled to the motor. The motor can be operated to configured to move the tube-adjusting device to move the walls of the tube such that a cross sectional area of a portion of the passage of the soft duct is changed.

According to one embodiment, a data center includes one or more rack computing systems in a computing room and a cooling system. The cooling system supplies air to the rack computing systems. The cooling system includes one or more soft ducts, and one or more air flow control devices. Tube-adjusting devices of the air flow control devices may be operated by one or more motors to move the walls of the tubes the tubes such that the cross sectional area of passages of the soft duct are changed to vary a cross sectional area of a portion of the passages.

According to one embodiment, a method of controlling a flow of air includes operating a motor to move one or more walls of a soft duct such that a cross sectional area of a passage in the soft duct is changed, and moving air through the passage.

As used herein, "air handling system" means a system that provides or moves air to, or removes air from, one or more systems or components.

As used herein, an "aisle" means a space next to one or more racks.

As used herein, "ambient" refers to a condition of outside air at the location of a system or data center.

As used herein, to "cinch" means to pull around at least a portion of the exterior of an element, such as a duct, in a manner that tends to reduce the size of the element. Examples of cinching members for a duct include strap, a rope, a chain, a belt, or a cord.

As used herein, "computing" includes any operations that can be performed by a computer, such as computation, data storage, data retrieval, or communications.

As used herein, "computing device" includes any of various devices in which computing operations can be carried out, such as computer systems or components thereof. One example of a computing device is a rack-mounted server. As used herein, the term computing device is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. Some examples of computing devices include e-commerce servers, network devices, telecommunications equipment, medical equipment, electrical power management and control devices, and professional audio equipment (digital, analog, or combinations thereof). In various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, to "contract" a passage means to make the passage smaller (for example, shrink the size of the passage such that the cross sectional area of the passage is reduced).

As used herein, "data center" includes any facility or portion of a facility in which computer operations are carried out. A data center may include servers dedicated to specific functions or serving multiple functions. Examples of computer operations include information processing, communications, testing, simulations, power distribution and control, and operational control.

As used herein, "data center module" means a module that includes, or is suitable for housing and/or physically supporting, one or more computer systems that can provide computing resources for a data center.

As used herein, to "dilate" a passage means to make the passage larger (for example, allow the size of the passage to expand such that the cross sectional area of the passage is increased).

As used herein, a "duct" includes any tube, pipe, conduit, or combination thereof, that has one or more passageways through which a fluid can be conveyed. Examples of materials for a duct include cloth, fabric, extruded metal, sheet metal, a polymer, or a combination thereof. A passageway of a duct may have any size and shape. The cross section of a duct may be square, round, ovate, rectangular, or irregular, A passageway of a duct may have a constant or changing cross section or a cross section that changes over the length of the passageway.

As used herein, a "module" is a component or a combination of components physically coupled to one another. A module may include functional elements and systems, such as computer systems, racks, blowers, ducts, power distribution units, fire suppression systems, and control systems, as well as structural elements, such a frame, housing, or container. In some embodiments, a module is pre-fabricated at a location off-site from a data center.

As used herein, a "motor" means a machine that can convert energy into mechanical motion. Examples of motors include an electrical motor, a hydraulic motor, an actuator, a belt drive, or a chain drive.

As used herein, a "rack" means a rack, container, frame, or other element or combination of elements that can contain or physically support one or more computer systems.

As used herein, "rack computing system" means a system that includes one or more computing devices mounted in a rack.

As used herein, "room" means a room or a space of a building. As used herein, "computing room" means a room of a building in which computing devices, such as rack-mounted servers, can be operated.

As used herein, a "space" means a space, area or volume.

As used herein, a "soft duct" means duct that can be flexed, bent, or stretched to change the shape of the duct. Examples of materials for a soft duct include fabric, cloth, or polymeric sheeting.

In various embodiments, a system for conveying air includes a soft duct with a variable cross section control device. In some embodiments, a system for conveying air includes a soft duct with a variable cross section control device having a duct-constricting member. The duct-constricting member can reduce the cross sectional area of a passage through the duct.

FIG. 1 illustrates one embodiment of a data center with a system for conveying air that includes a soft duct with a variable cross section control device. Data center 100 includes rack computing systems 102 and air handling system 104. Air handling system 104 supplies air to computing room 106. Rack computing systems include racks 108 and computing devices 110. Air supplied to computing room 106 may be moved through racks 108 and computing devices 110. Air handling system 104 may be, in one embodiment, a computer room air conditioning unit ("CRAC").

Rack computing systems 102 may be deployed in computing room 106 of data center 100. Computing devices 110 may be operated to perform computing operations in the data center. Rack 108 is supported on a floor of computing room 106. The floor may be a raised floor. Rack 108 includes rack air inlets and rack air exits.

Air handling system 104 includes air handling unit 112, soft duct 114, vent 116, and air flow control device 118. Soft duct 114 may include one or more sections of tubing with a passage for conveying air. The tubular elements of soft duct 114 may be made of a material that is flexible and pliable. Examples of materials for a soft duct include a cloth, fabric, or polymer sheeting. Soft duct 114 may be made of material that allows the cross sectional area of the passage to be reduced at a location along the length of the duct by pressing in on or compacting the tube. For example, the cross sectional area of a portion of soft duct 114 may be reduced by clamping, squeezing or pressing on the exterior of soft duct 114.

In some embodiments, air moving through soft duct 114 at least partially inflates soft duct 114. Inflation of a soft duct may dilate a passage (for example, increase the diameter of a cylindrical duct) at one or more locations along the length of the duct, such that the cross sectional area of the soft duct is increased.

Airflow control device 118 includes cinching member 124, drive unit 128, and guide assemblies 130. Cinching member 124 may be flexible. For example, cinching member 124 may be a cord, a strap, a cable, a rope, or a chain. Cinching member 124 may serve as a tube-adjusting device. Cinching member 124 may be looped around soft duct 114 such that pulling on the end of cinching member 124 cinches soft duct 114 at the location of cinching member 124. Cinching soft duct 114 may decrease the cross sectional area of a passage through soft duct 114.

Cinching member 124 goes around the circumference of soft duct 124 and passes through guides 130. One end of cinching member 124 is wrapped on spool 132 of drive unit 128. Cinching member 124 may be collected on, and fed from spool 132 by operation of motor 136 of drive unit 128. Gathering cinching member 124 on spool 132 may cinch up soft duct 114.

Guide assemblies 130 include mounting base 142 and guide loop 144. Guide mounting bases 142 of guide assemblies 130 are attached to soft duct 114. Cinching member 124 successively passes through guide loops 144 as cinching member 124 loops around the outer circumference of soft duct 114. Guide loops 144 may maintain cinching member 124 in a loop around soft duct 114 at a desired location along the length of soft duct 114. One of guide assemblies 130 is held by guide bracket 149. Guide bracket 149 is carried on rail 147. Guide bracket 149 may limit displacement of one of guide assemblies 130 such that the passage in soft duct 114 remains generally inline with the rest of soft duct 114.

Airflow control device 118 may be operated to contract soft duct 114 at the location of cinching member 124. FIG. 1A illustrates one embodiment of a soft duct that has been constricted using an air flow control device. As is illustrated in FIG. 1A, soft duct 114 is necked down to a smaller diameter at the location of cinching member 124. In some embodiments, air pressure in a soft duct (for example, from an air handling system) dilates a passage in the soft duct 114. For example, air pressure from air handling system 112 may expand the material of soft duct 114 at the location of the cinching member 124. Air flow may re-expand the soft duct to a uniform diameter.

The size and shape of a passage through a soft duct may vary from embodiment to embodiment. For example, the cross section of soft duct 114 may be circular, rectangular, square, or ovate.

For illustrative purposes, only one rack computing system and one soft duct are shown in FIG. 1. A data center may, however, include any number of racks and any number of soft ducts. In some embodiments, rack computing systems are arranged in one or more rows in a computing room.

For illustrative purposes, three cinching member guides are shown around the circumference of soft duct 114. An airflow control device may nevertheless have in various embodiments, any number of guides around the outside of a soft duct. For example, an airflow control device may include 1 guide, 6 guides, or 10 guides for a constricting member.

Figure 2:
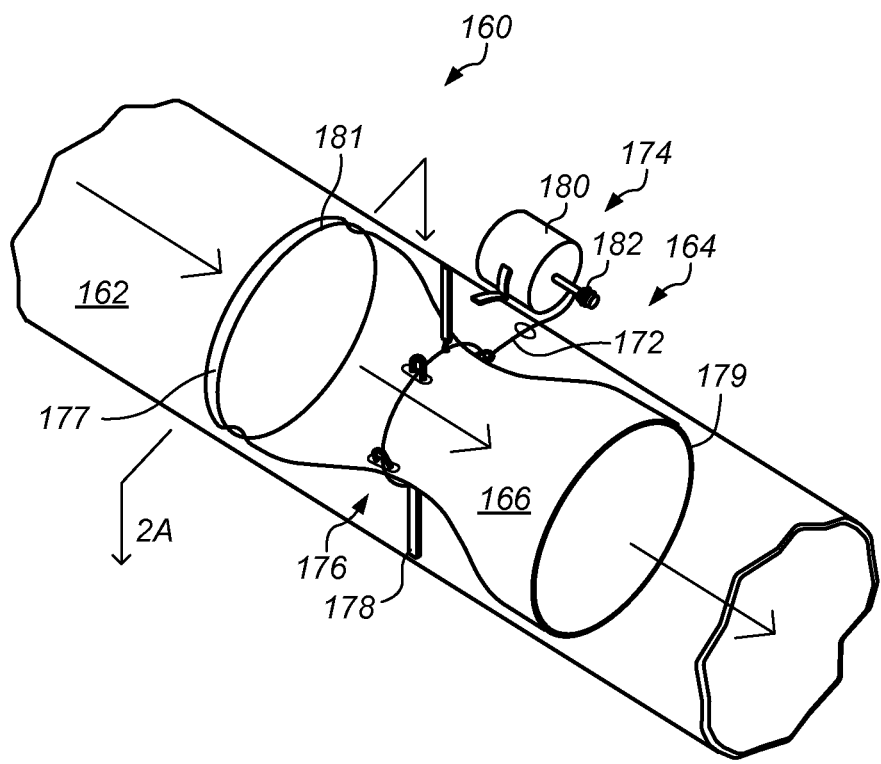
FIG. 2 illustrates one embodiment of a cooling system with a soft duct having an air flow control device in-line within a rigid duct.

In some embodiments, an airflow management system with contractible soft duct is placed in-line in a portion of a rigid duct. FIG. 2 illustrates one embodiment of a cooling system having a soft duct with an air flow control device in-line within a rigid duct. Cooling system 160 includes outer duct 162 and air flow management system 164. Outer duct 162 may be a rigid duct (for example, formed from sheet metal).

Airflow control management system 164 includes soft duct 166 and air flow control device 168. Airflow control device 168 includes cinching member 172, drive unit 174, guide assemblies 176, and guide members 178. Drive unit 174 includes motor 180 and spool 182. Motor 180 is mounted on outer duct 162.

Guide members 178 are mounted on the walls of outer duct 162. Cinching member 172 may be guided on loops of guide members 178. In some embodiments, guide members 178 help maintain a position of cinching member 172 in relation outer duct 162 (for example, centered within the outer duct).

Airflow control device 168 may be operated to vary the size of a passage through soft duct 166 in a manner similar to that described above for soft duct 114 described above relative to FIG. 1.

Figure 2A:
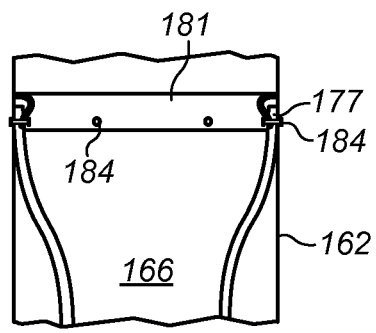
FIG. 2A is a cross sectional view of a cooling system having a crimped connection of a soft duct to an outer duct.

Soft duct 166 includes leading edge 177 and trailing edge 179. Leading edge 177 may be upstream in in cooling system 160 from trailing edge 179. Leading edge 177 may be crimped into place in outer duct 162 under rim 181, as illustrated in FIG. 2A. Soft duct 166 may be secured in place by pop rivets 184. In certain embodiments, both the leading portions and the trailing portions of a soft duct are secured to an outer duct. Thus, for example, in certain embodiments, outer duct 162 may include a second rim for crimping down trailing edge 179.

Figure 3:
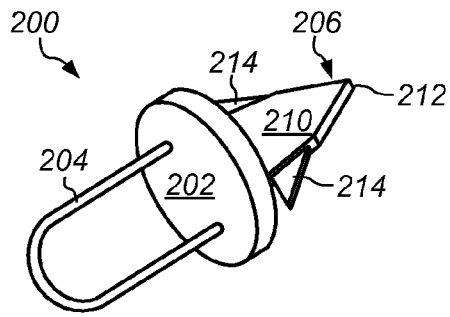
FIG. 3 illustrates one embodiment of a guide for duct-contracting member.

In some embodiments, guides for duct-contracting device are installed in the walls of the duct. FIG. 3 illustrates one embodiment of a guide for duct-contracting member. Guide 200 includes mounting base 202, guide loop 204, and fastener 206. Guide 200 may be used, for example, to carry cinching member 124 described above relative to FIG. 1. Guide fastener 206 includes body 210, spike 212, and retention barbs 214. Retention barbs 214 may be spring-loaded in body 210. To install guide 200 on a soft duct, spike 212 may puncture fabric in the soft duct, such as soft duct 114 described above relative to FIG. 1. Body 210 may pass through the opening in the fabric made by spike 212. As body 210 passes through the fabric, retention barbs 214 may pop-out, inhibiting separation of guide 200 from the fabric.

Figure 4A:
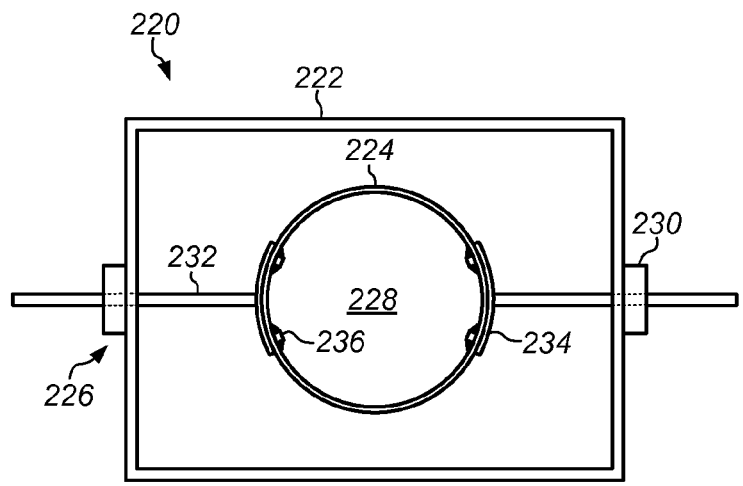
FIGS. 4A and 4B illustrates one embodiment of a cooling air system with opposed soft duct reduction devices.
Figure 4B:
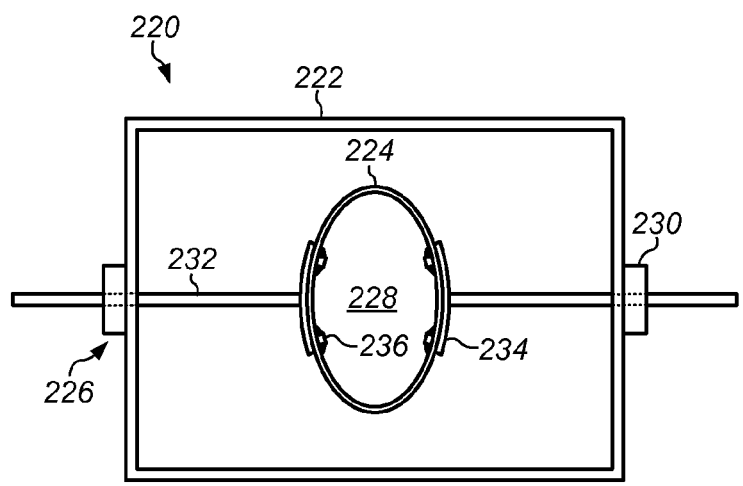

In some embodiments, an air flow control device includes multiple devices that can be used to alter the shape or size of a soft duct. FIGS. 4A and 4B illustrates one embodiment of a cooling air system with opposed flow control mechanisms. In FIGS. 4A and 4B, elements of duct are shown in cross section taken perpendicular to the direction of flow. Cooling system 220 includes outer duct 222, soft duct 224, and flow control mechanisms 226. An air moving device, such as a blower, may move air through ducts in cooling system 220, such as outer duct 222 and soft duct 224. Soft duct 224 may be coupled to outer duct 222 upstream and downstream of flow control mechanisms such that air is channeled through passage 228 in soft duct 224 at the location represented in FIGS. 4A and 4B.

Flow control mechanisms 226 each include linear drive unit 230, rod 232, and soft duct connector plate 234. Soft duct connector plates 234 are attached to opposing walls of soft duct 224. Soft duct connector plates 234 are carried on rods 232 at the inner ends of the rods. Rods 232 are carried on linear drive units 230. Linear drive units 230 may be operated to move rods 232 in and out relative to the walls of outer duct 222 (left and right in FIGS. 4A and 4B). For example, rods 232 may be moved toward one another decrease the cross sectional area of passage 228. Rods 232 may be moved away from one another increase the cross sectional area of passage 228. Reducing the cross sectional area of a soft duct passage may reduce the rate of air flow through soft duct 224.

FIG. 4B shows cooling system 220 after flow control mechanisms 226 have been operated to reduce the width of passage 228.

Soft duct connector plates 234 include retainers 236. Retainers 236 may puncture the walls of soft duct 224. Retainers 236 may include barbs that inhibit separation of the walls of soft duct 224 from soft duct connector plates 234. In some embodiments, retainers 236 include spring-loaded elements that deploy (for example, pop out) after the elements pass through the wall of soft duct 224. In some embodiments, retainers are snap-fitted into openings in a wall of a soft duct.

In some of the embodiments described above, a soft duct constricting member is held in place on a soft duct by way of guides or connectors that are installed by puncturing the wall of a soft duct. Guides, positioning elements, or securing elements for a constricting member may, however, in various embodiments be connected to a soft duct in other manners. Other manners of attachment of a guide or connector include adhesives, screws, hook and loop strips, and clips. In some embodiments, a constricting member is not secured or guided on the soft duct. For example, a constricting strap may be draped around the circumference of a soft duct without attachment.

Figure 5:
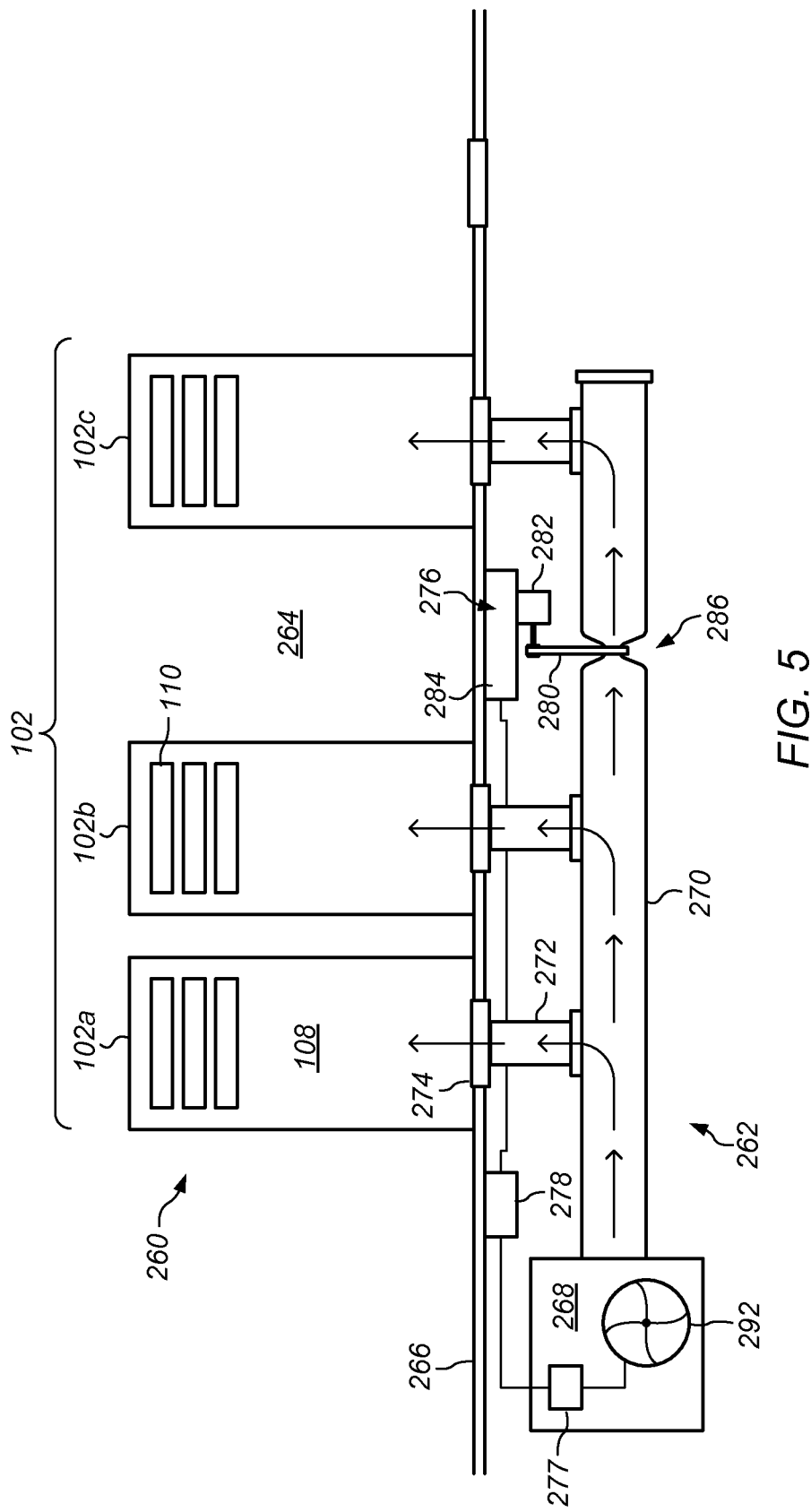
FIG. 5 illustrates one embodiment of a data center having a cooling system with a device for constricting flow to part of the rack computing systems in a room.

In some embodiments, a cooling system for a data center controls air flow to different electrical systems by varying the size of a duct. FIG. 5 illustrates one embodiment of a data center having a cooling system with a device for constricting flow to part of the rack computing systems in a room. Data center 260 includes rack computing systems 102 and air handling system 262. Air handling system 262 supplies air to computing room 264. Rack computing systems 102 include racks 108 and computing devices 110. Rack computing systems 102 rest on raised floor 266 of computing room. Air handling system 262 supplies air to computing room 106. Rack computing systems include racks 108 and computing devices 110.

Air handling system 262 includes air handling unit 268, soft duct 270, vertical ducts 272, floor vents 274 air flow control device 276, and control unit 278. Airflow control device 278 includes cinching member 280, drive unit 282, and airflow control unit 284. Airflow control device 276 may be operated to alter the size of a passage through soft duct 270, in a manner similar to that described above relative to FIG. 1. In FIG. 5, airflow control device 276 is shown to partially constrict a passage of soft duct 270 at station 286. The contracted passage at station 286 supplies some air to rack computing system 102c. The size of the passage through soft duct 270 at station 286 may be adjusted to balance airflow among rack computing systems 102a, 102b, and 102c.

Figure 6:
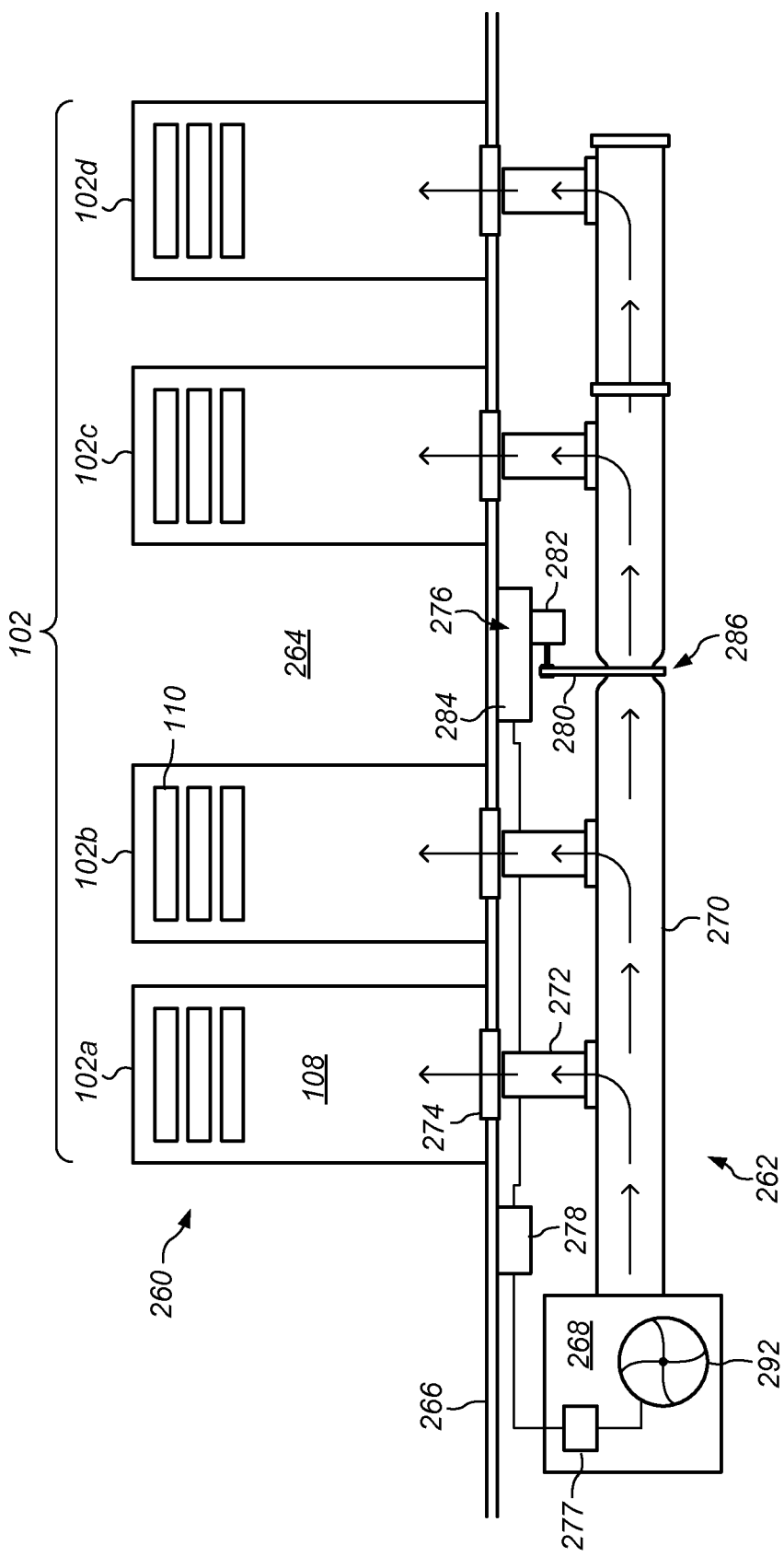
FIG. 6 illustrates a data center in which a soft duct has been allowed to increase to supply air to rack computing systems that have been added to a data center.

In some embodiments, a passage through a soft duct may be changed to adjust flow to support additional computing devices in a data center. FIG. 6 illustrates a data center in which a soft duct has been allowed to increase to supply air to rack computing systems that have been added to a data center. In FIG. 6, data center 260 has been expanded from what was shown in FIG. 6 to include additional rack computing systems 102b, and airflow control device 276 has been operated to allow a passage through soft duct 270 to be dilated at station 286 along the length of soft duct 270. The larger passage through soft duct 270 at station 286 allows more air to be provided to the duct to the right of station 286 to support the addition of rack computing system 102d.

Control unit 278 may be coupled to air handling unit 268 and airflow control device 276. Control unit 278 may control a rate of flow at one or more locations in or from air handling system 262. Air handling unit 268 includes variable frequency drive 277 coupled to control unit 278. Control unit 278 may be operated to vary the speed of air moving device 292 in air handling unit 268 using variable frequency drive 277.

In certain embodiments, control unit 278 includes at least one programmable logic controller. The PLC may, among other things, control air flow control devices in air handling system 262, such as airflow control device 276. In some embodiments, airflow is controlled in response to sensors in the data center, such as temperature or flow sensors.

A control system may include temperature measurement devices that are, in one embodiment, thermocouples. Alternatively, the temperature measurement devices include, but are not limited to, resistance temperature detectors (RTDs) and any device that facilitate cooling operation as described herein. For example, a thermocouple may be positioned within mixing plenum to facilitate measuring a temperature of the air the mixing plenum.

In various embodiments, operation of one or more conduit sub-systems that supply air from a subfloor space may be controlled in response to one or more conditions. For example, control unit 278 may be programmed to increase or decrease air flow rates in a rack computing system based on predetermined conditions, such as temperature and humidity, are measured in the rack.

Although in the embodiment shown in FIGS. 5 and 6, a soft duct constricting device is included upstream from the electrical systems being cooled, a soft duct constricting device may in various embodiments be included in other locations. In one embodiment, for example, soft duct constricting devices are included on return air duct and an outside air duct that both feed a mixing plenum. The mix of air between return air and outside air may be adjusted by altering the size of the passage at one or more constricting device of the constricting devices.

Figure 7:
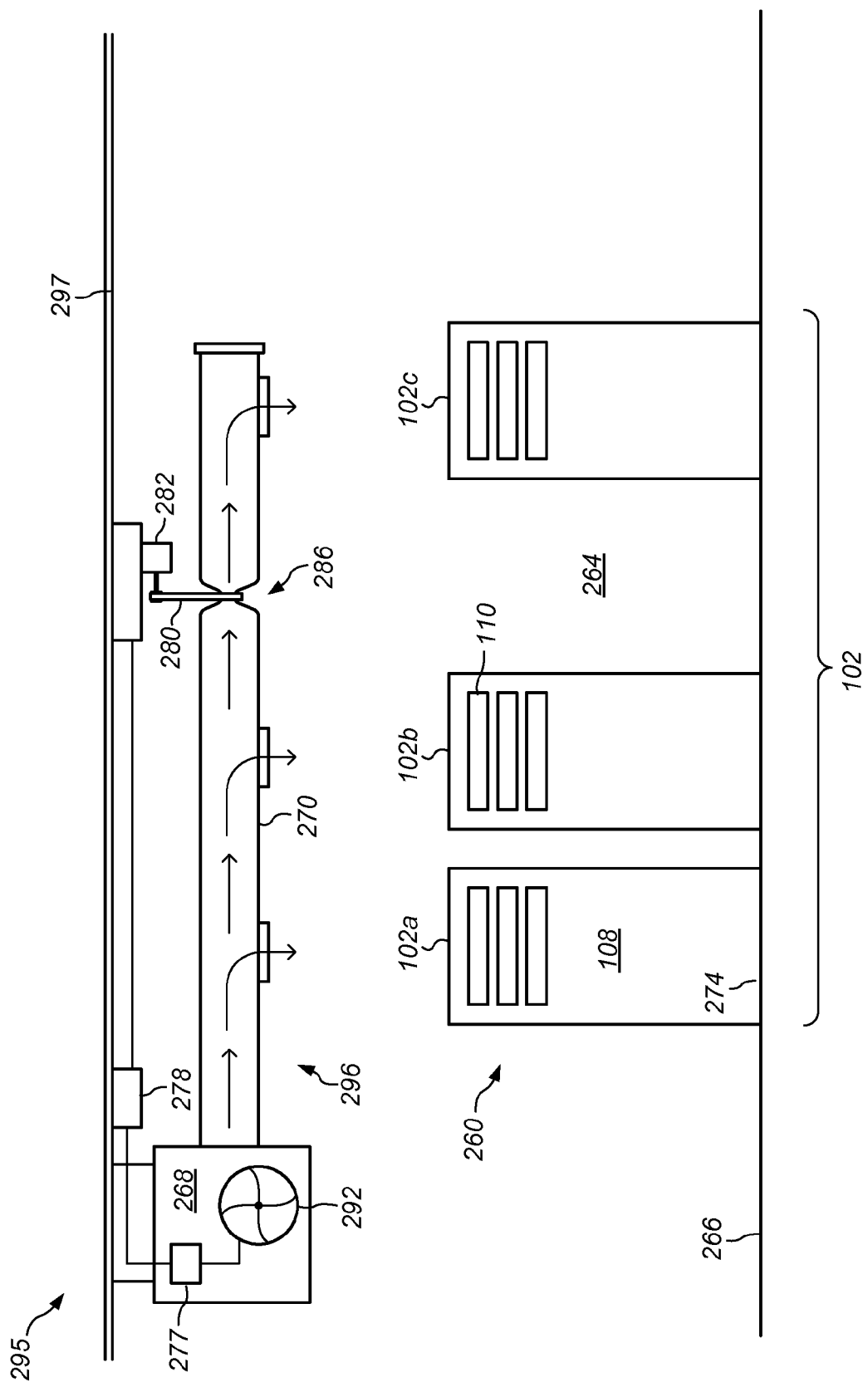
FIG. 7 illustrates one embodiment of a data center having a cooling system with overhead soft ducting a device for constricting flow to part of the rack computing systems in a room.

In some embodiments, air flow control devices are included on in an open network of soft ducts of a cooling system. In one embodiment, air flow control devices are included on an air distribution having soft ducts suspending from above rack computing systems in a room of a building. FIG. 7 illustrates one embodiment of a data center having a cooling system with overhead soft ducting a device for constricting flow to part of the rack computing systems in a room. System 295 includes air handling system 296. Air handling system 296 is attached to ceiling 297.

In certain embodiments, control system 277 includes at least one programmable logic controller. The PLC may, among other things, actuate constricting members of air flow control devices as necessary for the prevailing operational conditions. Measured conditions that may be used by a controller to control air flow include temperature, humidity, and pressure.

In various embodiments, operation of one or more air handling modules of a cooling system may be controlled in response to one or more conditions. For example, the controller may be programmed to constrict or dilate one or more constricting members on soft ducts when one or more predetermined conditions are met, such as temperature, pressure, and humidity. In one embodiment, air flow control devices on soft ducts are used to adjust air flow based on a pre-set temperature range at one or more locations in an air flow control system or at a location in a building.

In some embodiments, control systems for two or more air flow control devices for soft ducts are connected by way of a computer network. In some embodiments, messages are exchanged between one or more air flow control systems having soft ducts and a building management system. Messages may, in one embodiment, be exchanged using Simple Network Management Protocol (SNMP) data (for example, an SNMP trap). Any network protocol, however, may be used in various embodiments to send data from, or receive data into, an air flow control system.

Figure 8:
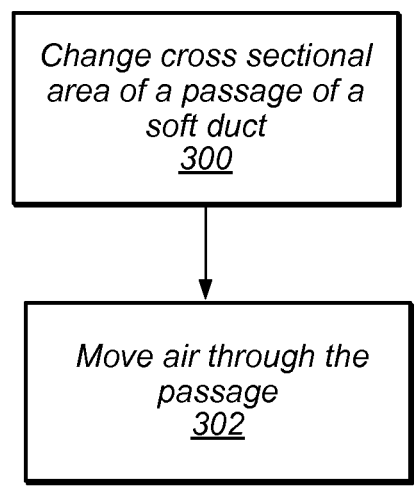
FIG. 8 illustrates controlling air flow by changing a cross section of a passage in a soft duct.

FIG. 8 illustrates controlling air flow by changing a cross section of a passage in a soft duct. At 300, a cross sectional area of a passage in a soft duct is changed. Changing the cross section of the passage of the soft duct may include operating a motor to move one or more walls of the soft duct. In some embodiments, the cross sectional area is changed by constricting the soft duct (for example, cinching the soft duct with a strap). In some embodiments, a soft duct inflates to increase a cross section of a passage after the constricting member has been loosened around the soft duct.

In some embodiments, the cross sectional is changed in response to measured characteristics of air. For example, a cross section of a soft duct passage may be changed in response to a measurement of a flow rate downstream from a flow control device, or in response to a measurement of temperature in a rack.

At 302, air is moved through the passage of the soft duct. Air may be moved through the passage by an air moving device of an air handling system. In some embodiments, air flow is supplied to computing devices (for example, servers in a rack). The size of the duct passage may be varied to produce a desired amount of airflow in the servers. In certain embodiments, the air flow from the soft duct is supplied to a mixing plenum.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A data center, comprising:
one or more rack computing systems in a computing room; and
a cooling system configured to supply air to at least one of the rack computing systems, wherein the cooling system comprises:
one or more soft ducts, comprising:
one or more tubes; and
one or more passages through at least a portion of at least one of the tubes; and
one or more air flow control devices, comprising:
one or more cinching members coupled around a circumference of at least one of the tubes of at least one of the soft ducts; and
one or more motors,
wherein at least one of the motors is configured to cause a pulling force to be exerted on an end of at least one of the one or more cinching members to cause the cinching member to constrict around the circumference of the at least one of the tubes such that a cross sectional area of a portion of a passage of a soft duct comprising the at least one tube is changed.

2. The data center of claim 1, wherein at least one of the one or more air flow control devices is configured to vary the cross sectional area of the portion of the passage of the soft duct to control a mix of air from two or more sources.

3. The data center of claim 1, wherein at least one of the one or more air flow control devices is configured to vary the cross sectional area of the portion of the passage of the soft duct to control a distribution of air among at least two of the rack computing systems.

4. The data center of claim 1, further comprising a control system and a network, wherein the control system is coupled to at least one of the one or more air flow control devices by way of the network, wherein the control system is configured to operate at least one of the motors to move at least one of the cinching members.

5. A system for conveying air from one location to another, comprising:
a soft duct comprising a passage; and
an air flow control device comprising:
a cinching member coupled around a circumference of the soft duct; and
a motor, wherein the motor is configured to cause a pulling force to be exerted on an end of the cinching member to cause the cinching member to constrict around the circumference of the soft duct to reduce a cross sectional area of a portion of the passage of the soft duct.

6. The system of claim 5, wherein the soft duct is configured to inflate to increase the size of the passage of the soft duct after the cinching member is loosened.

7. The system of claim 5, further comprising an outer duct, wherein at least a portion of the soft duct is inside the outer duct, wherein the soft duct is coupled to the outer duct in at least one location along the length of the outer duct.

8. The system of claim 5, further comprising a control system coupled to the motor, wherein the control system is configured to operate the motor to change the cross sectional area of the passage of the soft duct.

9. A system for conveying air from one location to another, comprising:
a soft duct comprising:
a tube comprising one or more walls; and
a passage through at least a portion of the tube; and
an air flow control device comprising:
a cinching member coupled around a circumference of the tube of the soft duct; and
a motor, wherein the motor is configured to cause a pulling force to be exerted on the end of the cinching member to cause the cinching member to constrict around at least one of the walls of the tube such that a cross sectional area of a portion of the passage of the soft duct is changed.

10. The system of claim 9, wherein the air flow control device is configured to cause a diameter of the passage through the soft duct in at least one location along the length of the duct to decrease.

11. The system of claim 9, wherein the air flow control device is configured to cause a diameter of the passage through the soft duct in at least one location along the length of the duct to increase.

12. The system of claim 9, wherein the air flow control device further comprises one or more spools, wherein at least one of the one or more spools is coupled to the motor such that the motor is configured to rotate the spool to exert the pulling force on the end of the cinching member.

13. The system of claim 9, further comprising at least one guide member configured to guide at least a portion of at least one of the cinching members, wherein at least a portion of the guide member is coupled to a fixed structure.

14. The system of claim 9, wherein the air flow control device further comprises a controller coupled to the motor, wherein the controller is operable to cause the cross sectional area of a portion of the soft duct to contract or dilate.

15. The system of claim 9, further comprising a control system and a network, wherein the control system is coupled to the air flow control device by way of the network, wherein the control system is configured to operate the motor to cause the cinching member to constrict around the at least one of the walls of the tube.

16. The system of claim 9, further comprising an outer duct, wherein the soft duct is at least partially inside the outer duct and coupled to the outer duct in at least one location along the length of the outer duct.

17. The system of claim 16, wherein the motor is operable to to cause the cinching member to loosen around the at least one of the walls of the tube to dilate the cross sectional area of a portion of the soft duct.

18. The system of claim 9, wherein the soft duct comprises a fabric.

19. The system of claim 9, wherein the air flow control device comprises:
one or more cinching member guides attached to the soft duct, wherein the at least one of the cinching member guides is configured to guide the cinching member relative to the soft duct.

20. The system of claim 19, wherein at least one of the cinching member guides comprises a retaining portion configured to pass through at least one of the one or more walls of the soft duct, wherein the retaining portion is configured to inhibit separation of the cinching member guide from the soft duct.

21. The system of claim 20, wherein at least one of the cinching member guides comprises a puncturing portion configured to puncture an opening in at least one of the one or more walls of the soft duct, wherein the retaining portion is configured to pass through the opening made by the puncturing portion.

22. A method of controlling a flow of air, comprising:
operating a motor to constrict or dilate a cinching member around a soft duct such that a cross sectional area of a passage in the soft duct is changed, wherein to constrict the cinching member tension at an end of the cinching member is increased and wherein to dilate the cinching member tension on the end of the cinching member is decreased; and
moving air through the passage.

23. The method of claim 22, wherein operating the motor to constrict or dilate a cinching member around a soft duct comprises varying a diameter of the soft duct along a portion of the duct.

24. The method of claim 22, further comprising measuring one or more characteristics of air, wherein operating the motor to constrict or dilate the cinching member around the soft duct comprises changing the cross sectional area of the passage in response to at least one of the measured characteristics of air.

25. The method of claim 22, wherein operating the motor to constrict or dilate the cinching member around the soft duct comprises coupling a guide to the soft duct, and moving the cinching member through the guide.

26. The method of claim 22, wherein operating the motor to constrict or dilate the cinching member around the soft duct increases or decreases cooling air to a set of computing devices.

27. The method of claim 22, wherein operating the motor to constrict or dilate the cinching member around the soft duct changes a mix of air among two or more sources.

* * * * *